United States Patent
Guo et al.

(10) Patent No.: US 7,026,181 B2
(45) Date of Patent: Apr. 11, 2006

(54) METHOD FOR FORMING LED BY A SUBSTRATE REMOVAL PROCESS

(75) Inventors: Jan-Der Guo, Hsinchu (TW); Wen-Chung Tsai, Hsinchu (TW); Tsung-Yu Chen, Keelung (TW); Shao-Hua Huang, Pingihen (TW)

(73) Assignee: Advanced Epitaxy Technology, Hukuo (TW)

( * ) Notice: Subject to any disclaimer, the term of this patent is extended or adjusted under 35 U.S.C. 154(b) by 0 days.

(21) Appl. No.: 11/195,526

(22) Filed: Aug. 1, 2005

(65) Prior Publication Data

US 2005/0272176 A1 Dec. 8, 2005

Related U.S. Application Data

(62) Division of application No. 10/773,122, filed on Feb. 5, 2004, now Pat. No. 6,969,626.

(51) Int. Cl.
*H01L 21/00* (2006.01)

(52) U.S. Cl. .................................................. 438/29

(58) Field of Classification Search .................. 438/29
See application file for complete search history.

(56) References Cited

U.S. PATENT DOCUMENTS

| 4,218,270 A | 8/1980 | Hasegawa et al. |
| 5,403,916 A | 4/1995 | Watanabe et al. |
| 5,453,405 A | 9/1995 | Fan et al. |
| 5,798,537 A | 8/1998 | Nitta |
| 6,657,238 B1 | 12/2003 | Ueda |
| 6,818,531 B1 | 11/2004 | Yoo et al. |
| 6,831,302 B1 | 12/2004 | Erchak et al. |
| 2003/0189212 A1* | 10/2003 | Yoo .......................... 257/79 |
| 2003/0189215 A1* | 10/2003 | Lee et al. .................. 257/94 |

* cited by examiner

*Primary Examiner*—Asok Kumar Sarkar
(74) *Attorney, Agent, or Firm*—Perkins Coie, LLP

(57) ABSTRACT

The present invention relates to a method for forming LED. In the present invention, LED dies are defined by photolithography and etching processes to replace a cutting step, and a metal substrate of the LED is formed by chemical or physical method.

8 Claims, 2 Drawing Sheets

METHOD FOR FORMING LED BY A SUBSTRATE REMOVAL PROCESS

CROSS-REFERENCE TO RELATED APPLICATION

This application is a divisional of U.S. patent application Ser. No. 10/773,122 filed Feb. 5, 2004, now U.S. Pat. No. 6,969,626 which is hereby incorporated by reference in its entirety.

TECHNICAL FIELD

This invention relates to a method for forming LED (light emitting diode), and more particularly to a method for forming LED by a chemical method or a physical method.

BACKGROUND

Basically, the principle of LED is to employ a characteristic of semiconductor to emit light. This is different from the conventional lighting apparatuses that lighting by discharging or heating, so the LED is called "cold light." Compared with the conventional the light bulb or the fluorescent tube, the LED has advantages of high durability, long life, light, low power consumption, and mercury-free.

The basic structure of LED is a PN diode structure that comprises a P-type epitaxial layer, an N-type epitaxial layer, and an active layer there between. In general, a current is input by two pads on the epitaxial layers of the LED. The pads may be formed on the same side or opposite sides according to the material selection of substrate and epitaxial layer, as shown in FIG. 1A and FIG. 1B. For example of GaN-based LED, the common substrate is an unconductive sapphire ($Al_2O_3$) or a conductive SiC. FIG. 1A shows a structure of a GaN LED with a sapphire substrate 40. An N-type epitaxial layer 30, an active layer 20, and a P-type epitaxial layer 10 are on the substrate 40 in sequence. Pads 25 and 15 are formed on an exposed region of the N-type epitaxial layer 30 and the P-type epitaxial layer 10, respectively. FIG. 1B shows a structure of a GaN LED with a SiC substrate 50. An N-type epitaxial layer 30, an active layer 20, and a P-type epitaxial layer 10 are on the substrate 50 in sequence. Pads 15 and 25 are formed on an upper surface of the P-type epitaxial layer 10 and a lower surface of the substrate 50, respectively.

Due to the light-absorbing and light-covering problems of the pads 15 and 25, some manufacturers produce LEDs by Flip-Chip technology for improving the illumination of LEDs. As shown in FIG. 1C, the LED structure is a reverse structure of that shown in FIG. 1A. The structure has a P-type epitaxial layer 10, an active layer 20, an N-type epitaxial layer 30, and a substrate 40 in sequence from bottom to top, and light is emitted upwards from the side of substrate 40. The substrate 40 is transparent, so it has no problem of light-absorbing or light-covering. The flip-chip LED is generally adhered to a submount 60, and a reflecting layer is formed to reflect the downward light emitted by the LED upwards. Furthermore, the submount 60 may be made of a material (as metal) having good cooling effect to diffuse the heat of LED, so it is proper to operate under high current. Hence, the LED having flip-chip structure improves the illumination and cooling effect.

Although the illumination of flip-chip LED is substantially increased and the flip-chip LED is proper to operate under high current, the product yield thereof is not well. That is resulted from the conventional Flip-Chip technology is to connect the pads of LED with the submount by bonding, and the bonding yield is not well. Hence, the yield of flip-chip LED is not efficiently increased, and the product cost is higher.

SUMMARY

In those conventional arts, the Flip-Chip technology for LED has some drawbacks and problems. Therefore, one of objectives of the present invention is to provide a method for forming LED to increase the LED yield.

Another objective of present invention is to form a substrate of LED by chemical or physical method for increasing the conductivity and cooling effect.

Still another objective of present invention is to form a reflecting layer for increasing the illumination of LED.

As aforementioned, the present invention provides a method for forming LED comprising the following steps. First, an LED epitaxial layer is formed on a provisional substrate. Then, the LED epitaxial layer is etched to form LED chips. A reflecting layer formed on the LED chips. Then, a metal layer formed on the reflecting layer by means of a chemical method or a physical method as permanent substrate. The provisional substrate is removed to expose surfaces of the LED chips. Pads are formed on the surfaces of the LED chips. Finally, the metal layer is separated to form individual LED chips by means of mechanical force.

The present invention also provides a method for forming LED comprising the following steps. First, an LED epitaxial layer is formed on a provisional substrate. Then, a reflecting layer is formed on the LED epitaxial layer. A metal layer is formed on the reflecting layer by means of a chemical method or a physical method as permanent substrate. Next, the LED epitaxial layer, the reflecting layer, and the metal layer are etched to form LED chips. The provisional substrate is removed to expose surfaces of the LED chips. Finally, pads are formed on the surfaces of the LED chips.

As aforementioned, in the present invention, the conductivity and cooling effect of the substrate is increased by replacing the conventional $Al_2O_3$ or SiC substrate with a metal substrate according to the present invention. Furthermore, the pads are formed on opposite sides, so only one pad needs to bond in package process and the bonding yield is increased. The LED is proper to operate with high current due to the well cooling effect of the metal layer, so the present invention can make high power LED. Moreover, a reflecting layer is formed on LED chip to guide the light of LED to emit outwards at the same direction, and the illumination of the LED is raised.

DETAILED DESCRIPTION

Some sample embodiments of the invention will now be described in greater detail. Nevertheless, it should be recognized that present invention can be practiced in a wide range of other embodiments besides those explicitly described, and the scope of the present invention is expressly not limited expect as specified in the accompanying claims.

Then, the components of the different elements are not shown to scale. Some dimensions of the related components are exaggerated and meaningless portions are not drawn to provide a more clear description and comprehension of the present invention.

The essence of the present invention is to form a metal layer by a chemical method and a physical method, and the metal layer is employed as a permanent substrate to replace the $Al_2O_3$ or SiC substrate in the conventional arts. Accordingly, the conductivity and the cooling effect of substrate can be efficiently increased, and further the pads are formed on opposite side, so only one pad needs to bond in package process. Moreover, the LED having the metal substrate is a high power LED due to the metal substrate has well cooling effect and the LED can operated with high current. The chemical method and physical method mentioned above comprise electroplating, electroless plating, CVD (chemical vapor deposition), (PVD) physical vapor deposition (as evaporation or sputtering deposition), and so on. These methods can control the thickness of the metal substrate and do not need the polishing and cutting process, and hence the complexity of LED process is also reduced. Furthermore, a reflecting layer is formed between the metal layer and the LED chip (or the LED epitaxial layer) to efficiently guide the light emitted by the LED chip to the same (outward) direction for increasing the illumination of the LED.

According to the aforementioned essence, the present invention discloses preferred embodiments for illustrating the method of forming the LED having the advantages mentioned above.

Figure 1A:
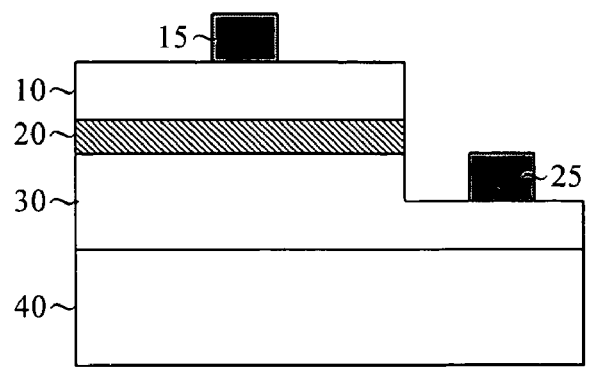
FIG. 1A to FIG. 1C are schematic diagrams of LED structure in conventional arts.
Figure 1B:
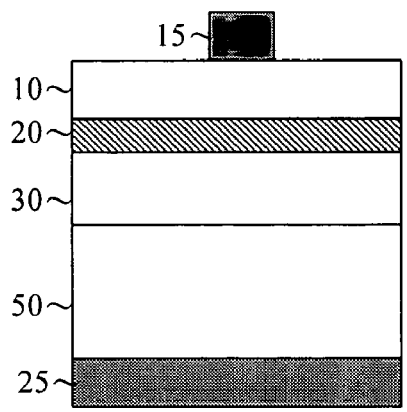
Figure 1C:
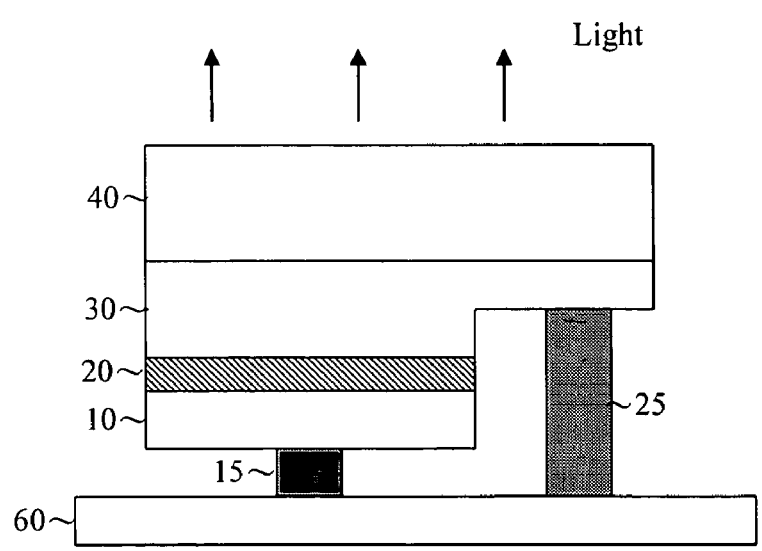
Figure 2A:
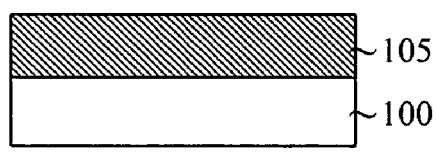
FIG. 2A to FIG. 2D are schematic diagrams of the method for forming LED of a preferred embodiment in the present invention.
Figure 2B:
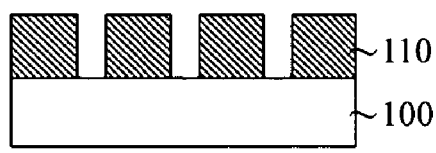
Figure 2C:
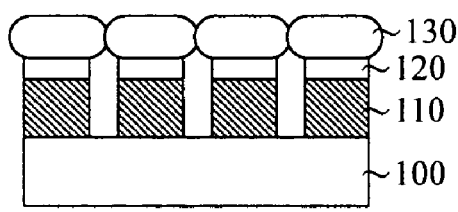

FIG. 2A to FIG. 2D are schematic diagrams of the method for forming LED of a preferred embodiment in the present invention. As shown in FIG. 2A, an LED epitaxial layer 105 is formed on a provisional substrate 100. Then, LED chips 110 is formed by etching the LED epitaxial layer, as shown in FIG. 2B. The preferable etching method is dry etching. Next, a reflecting layer 120 and a metal layer 130 are formed on the LED chips in sequence, wherein the metal layer 130 is formed by electroplating. The thickness of the metal layer between the every two LED chips is 5–30 μm for benefiting to separate the metal layer 130, as shown in FIG. 2C.

Figure 2D:
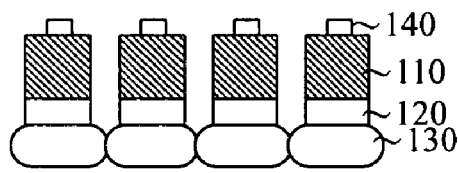

After that, the provisional substrate is removing by polishing, etching, or laser ablation, and pads 140 are formed on the exposed surfaces of the LED chips 110, as shown in FIG. 2D. Next, the metal layer is separated to form individual LED chips by means of mechanical force.

Figure 3A:
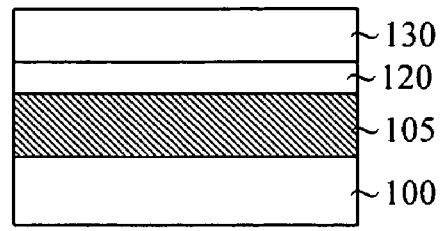
FIG. 3A to FIG. 3D are schematic diagrams of the method for forming LED of another preferred embodiment in the present invention.
Figure 3B:
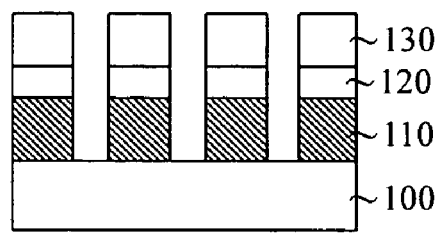

FIG. 3A to FIG. 3D are schematic diagrams of the method for forming LED of another preferred embodiment in the present invention. An LED epitaxial layer 105, a reflecting layer 120 and a metal layer 130 are formed on a provisional substrate 100 in sequence, wherein the metal layer 130 is formed by electroplating, as shown in FIG. 3A. Then, LED chips 110 is formed by etching the aforementioned structure as shown in FIG. 3B.

Next, the aforementioned LED structure is adhered on a film 150, and the provisional substrate is removing, as shown in FIG. 3O. Finally, pads 140 are formed on the exposed surfaces of the LED chips 110, as shown in FIG. 3D.

In the present invention, the reflecting layer reflects the light of LED to increase the outward illumination of LED. The preferable material of the reflecting layer is Ag, Al, Rh, Pt, Pd, Ni, Ti, Co, Au, and so on. If the LED is blue LED (as GaN LED), the material of the reflecting layer is not recommended to use Au due to Au may absorb the blue light.

In addition, the preferable material of the metal layer is Cu or other metal having well cooling effect, such as Al, Ni, Mo, W, Ag, Au, Ti, Co, Pd, Pt, or Fe. Therefore, the effect of diffusing heat is increased and the stability and life are also increased. The preferable thickness of the metal layer is 30–100 μm.

As aforementioned, the present invention provides a method for forming LED comprising the following steps. First, an LED epitaxial layer is formed on a provisional substrate. Then, the LED epitaxial layer is etched to form LED chips. A reflecting layer formed on the LED chips. Then, a metal layer formed on the reflecting layer by means of a chemical method or a physical method. The provisional substrate is removed to expose surfaces of the LED chips. Pads are formed on the surfaces of the LED chips. Finally, the metal layer is separated to form individual LED chips by means of mechanical force.

The present invention also provides a method for forming LED comprising the following steps. First, an LED epitaxial layer is formed on a provisional substrate. Then, a reflecting layer is formed on the LED epitaxial layer. A metal layer is formed on the reflecting layer by means of a chemical method or a physical method. Next, the LED epitaxial layer, the reflecting layer, and the metal layer are etched to form LED chips. The provisional substrate is removed to expose surfaces of the LED chips. Finally, pads are formed on the surfaces of the LED chips.

As aforementioned, in the present invention, the conductivity and cooling effect of the substrate is increased by replacing the conventional $Al_2O_3$ or SiC substrate with a metal substrate according to the present invention. Furthermore, the pads are formed on opposite sides, so only one pad needs to bond in package process and the bonding yield is increased. The LED is proper to operate with high current due to the well cooling effect of the metal layer, so the present invention can make high power LED. Moreover, a reflecting layer is formed on LED chip to guide the light of LED to emit outwards at the same direction, and the illumination of the LED is raised.

Although specific embodiments have been illustrated and described, it will be obvious to those skilled in the art that various modifications may be made without departing from what is intended to be limited solely by the appended claims.

What is claimed is:

1. A method for forming LED, comprising the steps of:
forming an LED epitaxial layer on a provisional substrate;
forming a reflecting layer on said LED epitaxial layer;
forming a metal layer on said reflecting layer;
etching said LED epitaxial layer, said reflecting layer, and said metal layer to form LED chips;
forming a film on said LED chips;
removing said provisional substrate to expose surfaces of said LED chips; and
forming pads on said surfaces of said LED chips.

2. The method in claim 1, wherein a material of said reflecting layer is Ag, Al, Rh, Pt, Pd, Ni, Ti, Co, Au, or the combination thereof.

3. The method in claim 1, wherein said metal layer is formed by means of electroplating, electroless plating, chemical vapor deposition, or the combination thereof.

4. The method in claim 1, wherein said metal layer is formed by means of a physical vapor deposition.

5. The method in claim 4, wherein said physical vapor deposition is evaporation, sputtering deposition, or the combination thereof.

6. The method in claim 1, wherein said provisional substrate is removed by means of polishing, etching, laser ablation, or the combination thereof.

7. The method in claim 1, wherein a material of said metal layer is Cu, Al, Ni, Mo, W, Ag, Au, Ti, Co, Pd, Pt, Fe, or the combination thereof.

8. The method in claim 1, wherein a thickness of said metal layer is more than 30 µm.

* * * * *

UNITED STATES PATENT AND TRADEMARK OFFICE
CERTIFICATE OF CORRECTION

PATENT NO. : 7,026,181 B2  
APPLICATION NO. : 10/378777  
DATED : April 11, 2006  
INVENTOR(S) : Jan-Der Guo et al.

Page 1 of 1

Figure 3C:
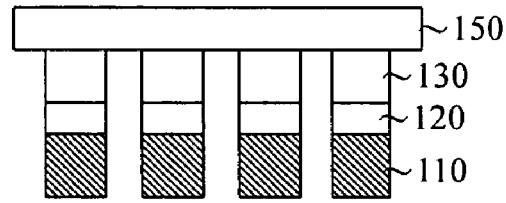
Figure 3D:
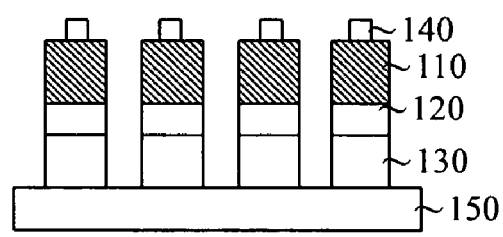

It is certified that error appears in the above-identified patent and that said Letters Patent is hereby corrected as shown below:

<u>Column 4</u>  
Line 12, "FIG. 30" should be --FIG. 3C--;

Signed and Sealed this

Twenty-second Day of August, 2006

JON W. DUDAS  
*Director of the United States Patent and Trademark Office*

UNITED STATES PATENT AND TRADEMARK OFFICE
CERTIFICATE OF CORRECTION

| | | |
|---|---|---|
| PATENT NO. | : 7,026,181 B2 | |
| APPLICATION NO. | : 11/195526 | |
| DATED | : April 11, 2006 | |
| INVENTOR(S) | : Jan-Der Guo et al. | |

It is certified that error appears in the above-identified patent and that said Letters Patent is hereby corrected as shown below:

Column 4
Line 12, "FIG. 30" should be --FIG. 3C--;

This certificate supersedes Certificate of Correction issued August 22, 2006.

Signed and Sealed this

Tenth Day of October, 2006

JON W. DUDAS
*Director of the United States Patent and Trademark Office*